United States Patent
Ono et al.

(10) Patent No.: US 9,761,648 B2
(45) Date of Patent: Sep. 12, 2017

(54) IMAGE DISPLAY APPARATUS

(71) Applicant: JOLED INC., Tokyo (JP)

(72) Inventors: Shinya Ono, Osaka (JP); Hitoshi Tsuge, Tokyo (JP); Kouhei Ebisuno, Tokyo (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 15/113,074

(22) PCT Filed: Dec. 22, 2014

(86) PCT No.: PCT/JP2014/006381
§ 371 (c)(1),
(2) Date: Jul. 21, 2016

(87) PCT Pub. No.: WO2015/114721
PCT Pub. Date: Aug. 6, 2015

(65) Prior Publication Data
US 2017/0012093 A1  Jan. 12, 2017

(30) Foreign Application Priority Data
Jan. 29, 2014 (JP) .................................. 2014-014746

(51) Int. Cl.
*H01L 27/32* (2006.01)
*H01L 51/52* (2006.01)

(52) U.S. Cl.
CPC ...... *H01L 27/3262* (2013.01); *H01L 27/3248* (2013.01); *H01L 27/3272* (2013.01); *H01L 51/5221* (2013.01); *H01L 2251/568* (2013.01)

(58) Field of Classification Search
None
See application file for complete search history.

(56) References Cited

U.S. PATENT DOCUMENTS 6,927,809 B2    8/2005  Gotoh et al.
7,566,903 B2 *  7/2009  Yamazaki ........... G02F 1/13454
                                                          257/59

(Continued)

FOREIGN PATENT DOCUMENTS

JP    10-228031      8/1998
JP    2002-350901   12/2002

(Continued)

OTHER PUBLICATIONS

Search Report issued by JAPAN patent office in International Patent Application No. PCT/JP2014/006381, dated Mar. 17, 2015.

*Primary Examiner* — Michelle Mandala
(74) *Attorney, Agent, or Firm* — Greenblum & Bernstein, P.L.C.

(57) ABSTRACT

An image display apparatus includes: a first pixel circuit including a driving transistor that drives a light emitting element and includes a gate electrode on a substrate, a semiconductor layer and a pair of source-drain electrodes; a second pixel circuit disposed adjacent to the first pixel circuit; a second pixel electrode that is formed above the second pixel circuit and is electrically connected to one of the pair of source-drain electrodes of the driving transistor of the first pixel circuit; and a top metal electrode that is electrically connected to one of the pair of source-drain electrodes and is formed to cover at least an entire channel region of the semiconductor layer from above.

8 Claims, 6 Drawing Sheets

(56) References Cited

U.S. PATENT DOCUMENTS

| | | |
|---|---|---|
| 8,599,149 B2 | 12/2013 | Lee et al. |
| 2004/0257489 A1 | 12/2004 | Gotoh et al. |
| 2010/0052534 A1* | 3/2010 | Lee .................... H01L 27/3262 |
| | | 315/51 |
| 2010/0309150 A1 | 12/2010 | Lee et al. |

FOREIGN PATENT DOCUMENTS

| | | |
|---|---|---|
| JP | 2004-151546 | 5/2004 |
| JP | 2006-215227 | 8/2006 |
| JP | 2010-282171 | 12/2010 |
| JP | 2011-085722 | 4/2011 |

* cited by examiner

IMAGE DISPLAY APPARATUS

TECHNICAL FIELD

The present disclosure relates to an image display apparatus that displays image data by delivering an electric current to a light-emitting element disposed in each pixel.

BACKGROUND ART

Patent Literature (PTL) 1 relates to a method for improving a light-emitting apparatus. With a pixel included in the light-emitting apparatus according to PTL 1, resistance wiring made of polysilicon is connected to a source region of a driving transistor formed on a transparent substrate. The resistance wiring is electrically connected to an anode of an organic EL (Electro Luminescent) element, which is a light emitting element, via a relay electrode.

If the pixel is a bright spot pixel (defect pixel) having a defect of short-circuit, repair processing of darkening the pixel into a dark spot is performed. In the repair processing, laser light is applied to the resistance wiring disposed in the defect pixel so as to melt a part or all of the resistance wiring. That is, the resistance wiring of the defect pixel is cut off by the applied laser light, and the supply of power to the organic EL element is interrupted. It is thereby possible to efficiently perform repair processing of darkening the defect pixel, which is a bright spot, into a dark spot without negatively affecting normal pixels.

CITATION LIST

Patent Literature

[PTL 1] Japanese Unexamined Patent Application Publication No. 2006-215227

SUMMARY OF INVENTION

Technical Problem

In an image display apparatus designed based on the assumption that the repair processing is performed, it is necessary to efficiently dispose an irradiation region that is irradiated with laser light and a wiring pattern that is provided within the irradiation region and can be cut off by laser cutoff processing in a small area while allowing the pixel circuit to function properly. The most efficient configuration is to dispose a pixel electrode of a pixel circuit provided in a single pixel above a pixel circuit provided in a pixel adjacent to the single pixel.

This configuration, however, is disadvantageous in that the pixel electrode of the single pixel varies the voltage of the pixel electrode disposed above the pixel circuit of the adjacent pixel according to the pixel current supplied by the pixel circuit of the single pixel, and this voltage fluctuation affects the pixel circuit of the adjacent pixel and in particular affects the characteristics of the driving transistor, as a result of which display quality is degraded.

It is an object of the present disclosure to improve display quality by suppressing the influence of voltage fluctuation of an adjacent pixel electrode.

Solution to Problem

An EL image display apparatus according to one aspect of the present disclosure includes: a first pixel circuit including a driving transistor that drives a light emitting element disposed in a pixel, the driving transistor including a gate electrode, a semiconductor layer, an insulation layer interposed between the gate electrode and the semiconductor layer, and a pair of source-drain electrodes on the semiconductor layer; a second pixel circuit disposed adjacent to the first pixel circuit; a pixel electrode above the second pixel circuit and is electrically connected to one of the pair of source-drain electrodes of the driving transistor of the first pixel circuit; and a top metal electrode that is electrically connected to one of the pair of source-drain electrodes, is provided below the pixel electrode, and is formed so as to cover at least an entire channel region of the semiconductor layer.

Advantageous Effects of Invention

According to the present disclosure, it is possible to improve display quality by suppressing the influence of voltage fluctuation of an adjacent pixel electrode.

DESCRIPTION OF EMBODIMENT

Hereinafter, an embodiment will be described in detail with reference to the accompanying drawings as appropriate. Note that, however, an overly detailed description may be omitted. For example, a detailed description of already known facts and a redundant description of substantially the same configurations may be omitted. This is to prevent the following description from being overly lengthy and to facilitate the understanding of a person having ordinary skill in the art.

Note that the accompanying drawings and the following description are provided by the present inventors so that a person having ordinary skill in the art can sufficiently understand the present disclosure, and thus they are not intended to limit the subject matter recited in the appended claims.

(Underlying Knowledge Forming Basis of the Present Disclosure)

The underlying knowledge forming the basis of the present disclosure will be described below before a detailed description of the present disclosure is presented.

Figure 1:
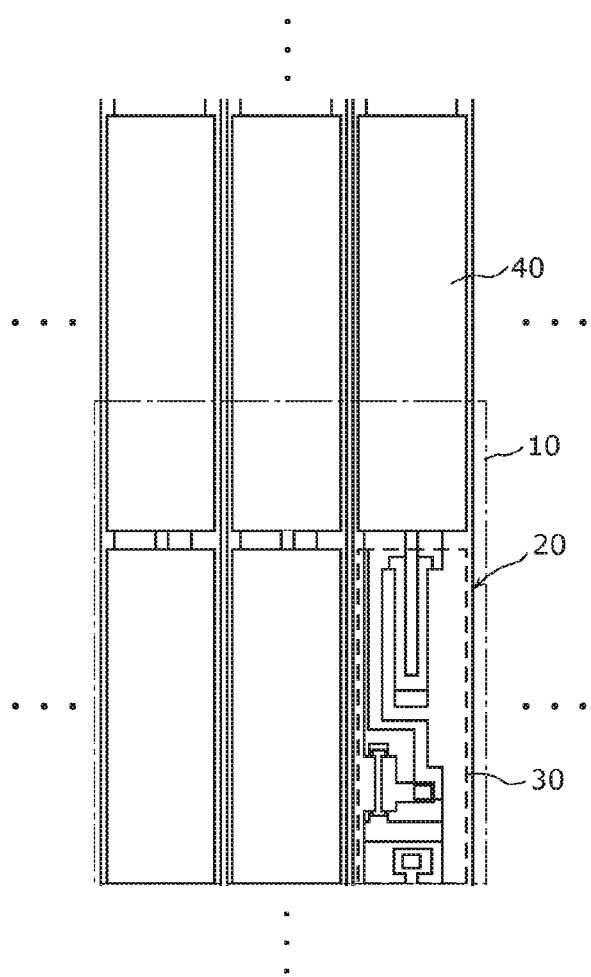
FIG. 1 is a top view of a pixel provided to illustrate the underlying knowledge forming the basis of the present disclosure.

FIG. 1 is a top view of a pixel provided to describe the underlying knowledge forming the basis of the present disclosure. FIG. 1 shows a part of a pixel array in which a plurality of pixels are arranged in rows and columns in an organic EL display apparatus, which is an image display apparatus according to the present disclosure.

In an organic EL display apparatus having a top-emission structure, when EL elements are driven by bottom-gate driving TFTs (Thin Film Transistors) of the pixels disposed in the organic EL display apparatus, a bright spot pixel (defect pixel) may be caused by, for example, a short-circuit between the source and the drain of a driving TFT. As a method for darkening such a bright spot pixel into a dark spot (repair processing), a method is used in which a DC current path extending from the driving TFT to the EL element is interrupted. For example, a method is used in which the wiring connecting the driving TFT and the pixel electrode is cut off by application of laser light.

Generally, in a pixel, the pixel electrode of the EL element is disposed so as to cover a channel region of the driving TFT of the pixel. This configuration, however, is problematic in that, in order to facilitate the application of laser light to wiring connecting the pixel circuit and the pixel electrode of the pixel, when the wiring is disposed between pixel electrodes of adjacent pixels, it is necessary to form the wiring pattern so as to be curved away from and back toward the pixel electrodes, which increases the area required to form the pattern. Accordingly, this configuration is not suitable to achieve a high resolution.

For this reason, as a pixel configuration for facilitating the application of laser light to the wiring connecting the pixel circuit and the pixel electrode, a configuration is used in which the pixel electrode of an adjacent pixel is disposed on the channel region of the driving TFT of the pixel.

To be specific, an organic EL display apparatus includes a pixel array in which a plurality of pixels 10 are arranged in rows and columns. As shown in FIG. 1, a pixel 10 includes at least three unit pixels 20, and at least three light emitting regions that emit three colors of R, G and B are disposed on the unit pixels 20.

Each of the unit pixels 20 includes a pixel circuit 30, a pixel electrode 40, a light emitting element EL (not shown) disposed on the pixel electrode 40, and an upper electrode (not shown) disposed on the light emitting element EL.

The pixel electrode 40 is made of, for example, aluminum or an alloy thereof, and is disposed above an adjacent pixel circuit 30. To be more specific, a pixel circuit 30 shown in the bottom right of FIG. 1 is connected to a pixel electrode 40 disposed above a pixel circuit 30 shown in the top right of FIG. 1, which is disposed adjacent to the pixel circuit 30 shown in the bottom right of FIG. 1. In FIG. 1, for the sake of clarity of illustration of a configuration of the pixel circuit 30 shown in the bottom right of FIG. 1, a pixel electrode 40 disposed thereon is shown in a see-through state.

Figure 2:
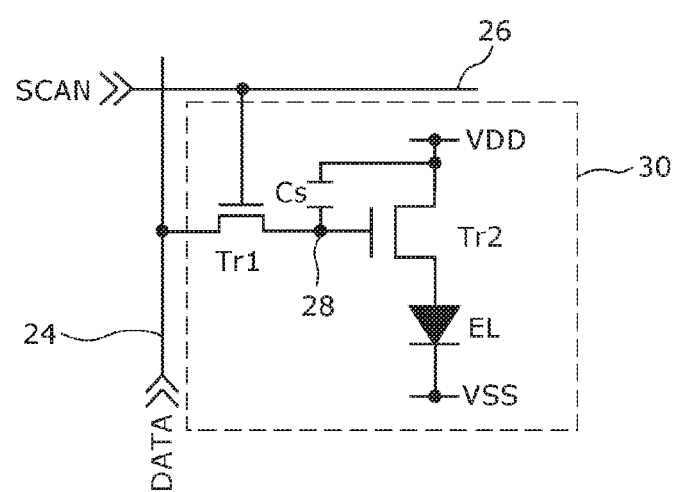
FIG. 2 is a schematic diagram showing a configuration of a pixel circuit according to the underlying knowledge forming the basis of the present disclosure.

FIG. 2 is a schematic diagram showing a configuration of one of the pixel circuits 30 included in the unit pixels 20 according to the underlying knowledge forming the basis of the present disclosure.

As shown in FIG. 2, the pixel circuit 30 includes a switching transistor Tr1, a driving transistor Tr2, a pixel capacitor Cs, and a light emitting element EL.

The source or the drain of the switching transistor Tr1 is connected to a DATA line 24 of the organic EL display apparatus. The gate of the switching transistor Tr1 is connected to a SCAN line 26. In response to a signal from the SCAN line 26, the switching transistor Tr1 is turned on, a voltage corresponding to an image signal supplied from the DATA line 24 is applied to the gate of the driving transistor Tr2 via the switching transistor Tr1, and the driving transistor Tr2 is turned on. As a result, an electric current corresponding to a gate-to-source voltage of the driving transistor Tr2 flows from a power supply VDD connected to the drain side of the driving transistor Tr2 to the light emitting element EL connected on the source side of the driving transistor Tr2, and the light emitting element EL emits light.

Figure 3:
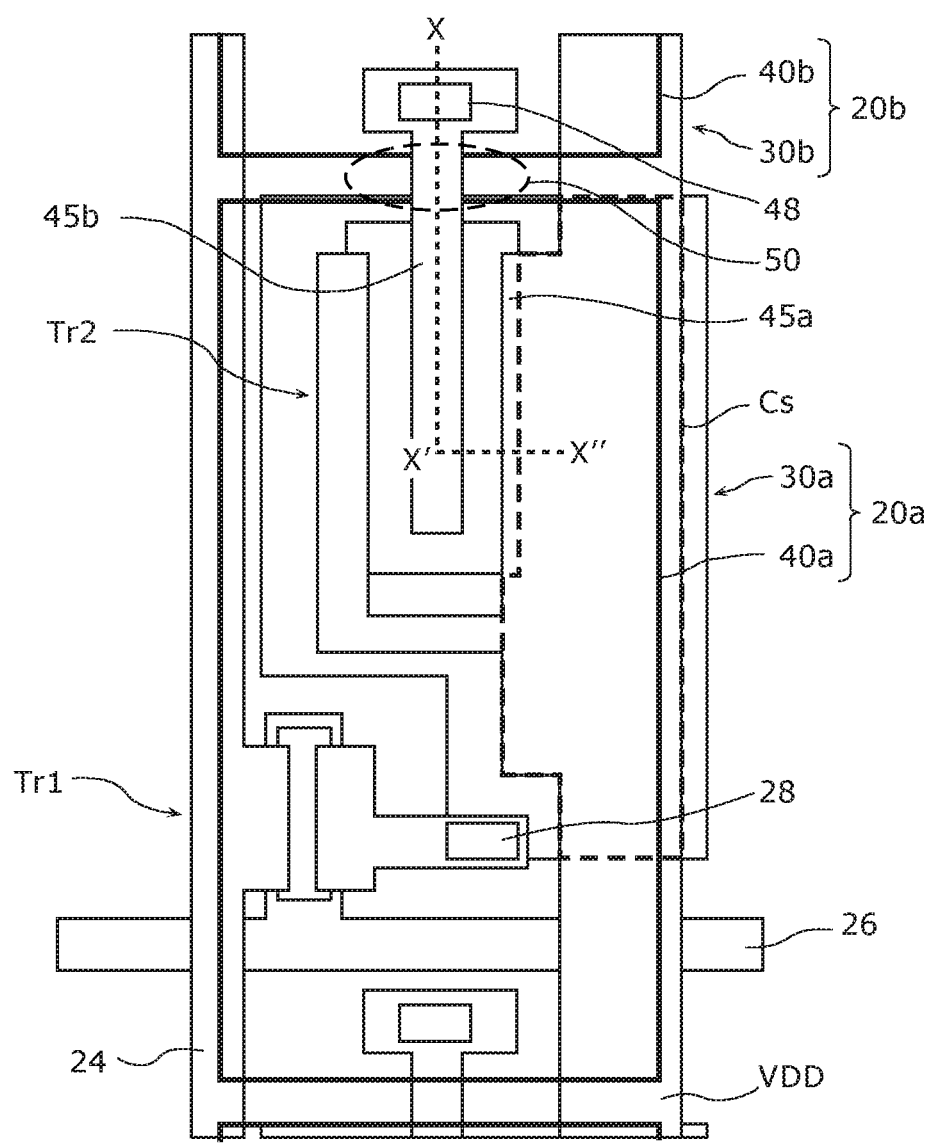
FIG. 3 is a top view showing the configuration of the pixel circuit according to the underlying knowledge forming the basis of the present disclosure.
Figure 4:
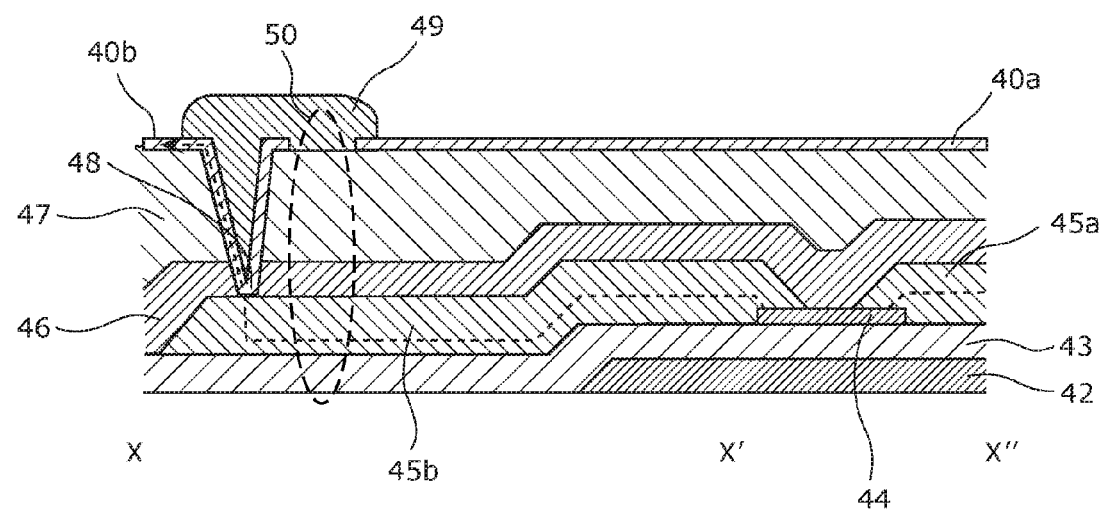
FIG. 4 is a cross-sectional view taken along the line X-X' and the line X'-X" shown in FIG. 3.

A configuration for implementing the pixel circuit is shown in FIGS. 3 and 4. FIG. 3 is a top view showing a configuration of the pixel circuit according to the underlying knowledge forming the basis of the present disclosure. FIG. 4 is a cross-sectional view taken along the line X-X' and the line X'-X" shown in FIG. 3. In FIGS. 3 and 4, illustration of the light emitting element EL is omitted. Also, FIGS. 3 and 4 show, as an example, a back-channel etch transistor.

In the organic EL display apparatus, the pixel electrode 40 connected to a pixel circuit 30 is disposed above an adjacent pixel circuit 30. That is, as shown in FIGS. 3 and 4, a first pixel circuit 30a and a second pixel circuit 30b are disposed adjacent to each other. A first pixel electrode 40a is disposed above the first pixel circuit 30a, and a second pixel electrode 40b is disposed above the second pixel circuit 30b.

Although the first pixel electrode 40a is shown by a thick solid line in FIG. 3, for the sake of clarity of illustration of a configuration of the first pixel circuit 30a, the first pixel electrode 40a is shown in a see-through state in FIG. 3. The same applies to the second pixel electrode 40b. Also, in the present embodiment, AM stands for anode metal, TM stands for top metal, and SD stands for source-drain.

Among source-drain electrodes 45a and 45b of the driving transistor Tr2 disposed in the first pixel circuit 30a, the source-drain electrode 45b that functions as a source node is connected to the second pixel electrode 40b via an AM-SD contact 48. A part of the source-drain electrode 45b is disposed between the first pixel electrode 40a and the second pixel electrode 40b as viewed from above. Accordingly, this portion is defined as an irradiation region 50. As a result of the irradiation region 50 being irradiated with laser light from the front surface or the back surface, the source-drain electrode 45b can be cut off, and the short-circuit of the first pixel circuit 30a can be eliminated.

As described above, in the pixel configuration in which the irradiation region 50 is formed based on the assumption that repair processing is performed, the pixel electrode 40b is disposed so as to cover the channel region of the driving transistor Tr2 of the second pixel circuit 30b provided in a second unit pixel 20b disposed adjacent to a first unit pixel 20a. With this configuration, the second pixel electrode 40b electrically connected to the first pixel circuit 30a, the second pixel electrode 40b being the electrode disposed on the back gate side of the driving transistor Tr2 of the second pixel circuit 30b serves as the back gate electrode of the driving transistor Tr2 of the second pixel circuit 30b, and the voltage of the second pixel electrode 40b produces a back gate effect of fluctuating a threshold voltage Vth of the driving transistor Tr2 provided in the second pixel circuit 30b. As a result, the state of the driving transistor Tr2 of the second unit pixel 20b is affected by the state of the light emitting element of the first unit pixel 20a, and causing the problem of degradation of display quality.

To address this, as will be described below, with an organic EL display apparatus according to the present disclosure, the display quality is improved by suppressing the influence of voltage fluctuation of the pixel electrode.

To be specific, with the organic EL display apparatus, the display quality is improved by disposing a back gate electrode so as to cover the channel region of a semiconductor layer, and shielding the influence of voltage fluctuation of a pixel electrode connected to an adjacent pixel circuit.

Hereinafter, an embodiment will be described.

Embodiment

An organic EL display apparatus according to an embodiment of the present disclosure will be described below with reference to FIGS. 5 to 8.

First, a configuration of the organic EL display apparatus be described.

Figure 5:
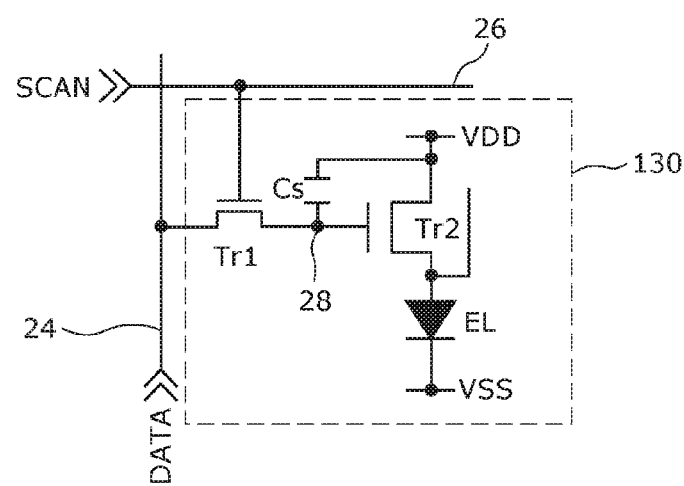
FIG. 5 is a schematic diagram showing a configuration of a pixel circuit according to an embodiment.
Figure 6:
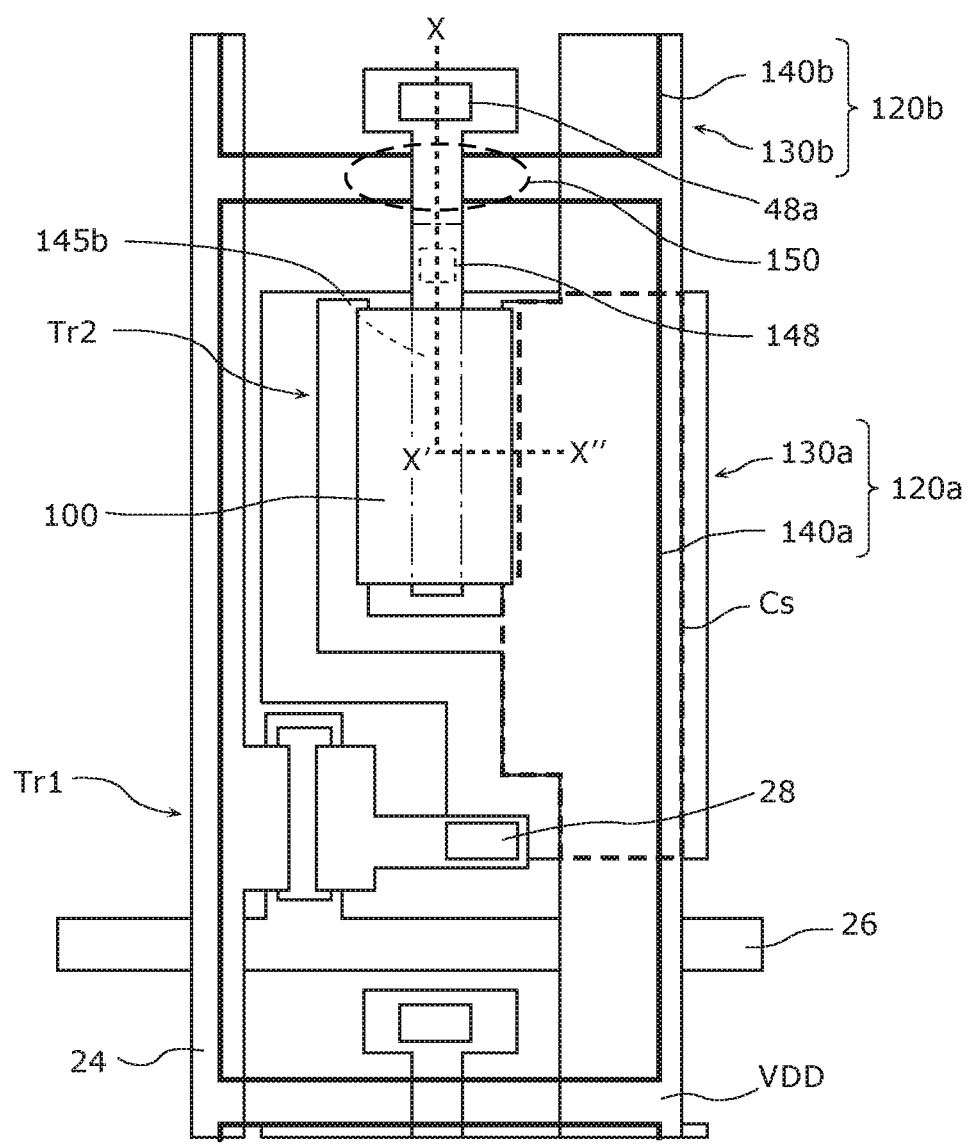
FIG. 6 is a top view showing the configuration of the pixel circuit according to the embodiment.
Figure 7:
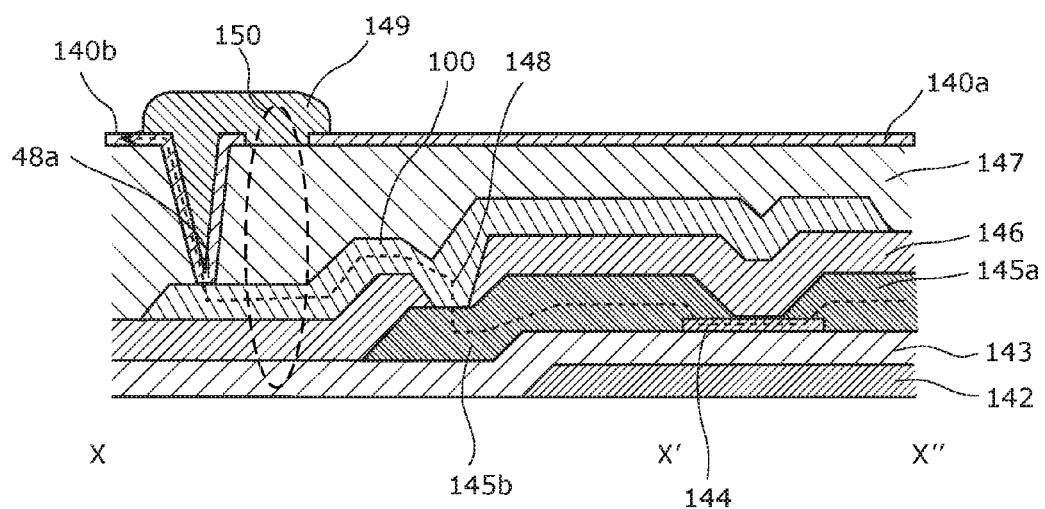
FIG. 7 is a cross-sectional view taken along the line X-X' and the line X'-X" shown in FIG. 6.
Figure 8:
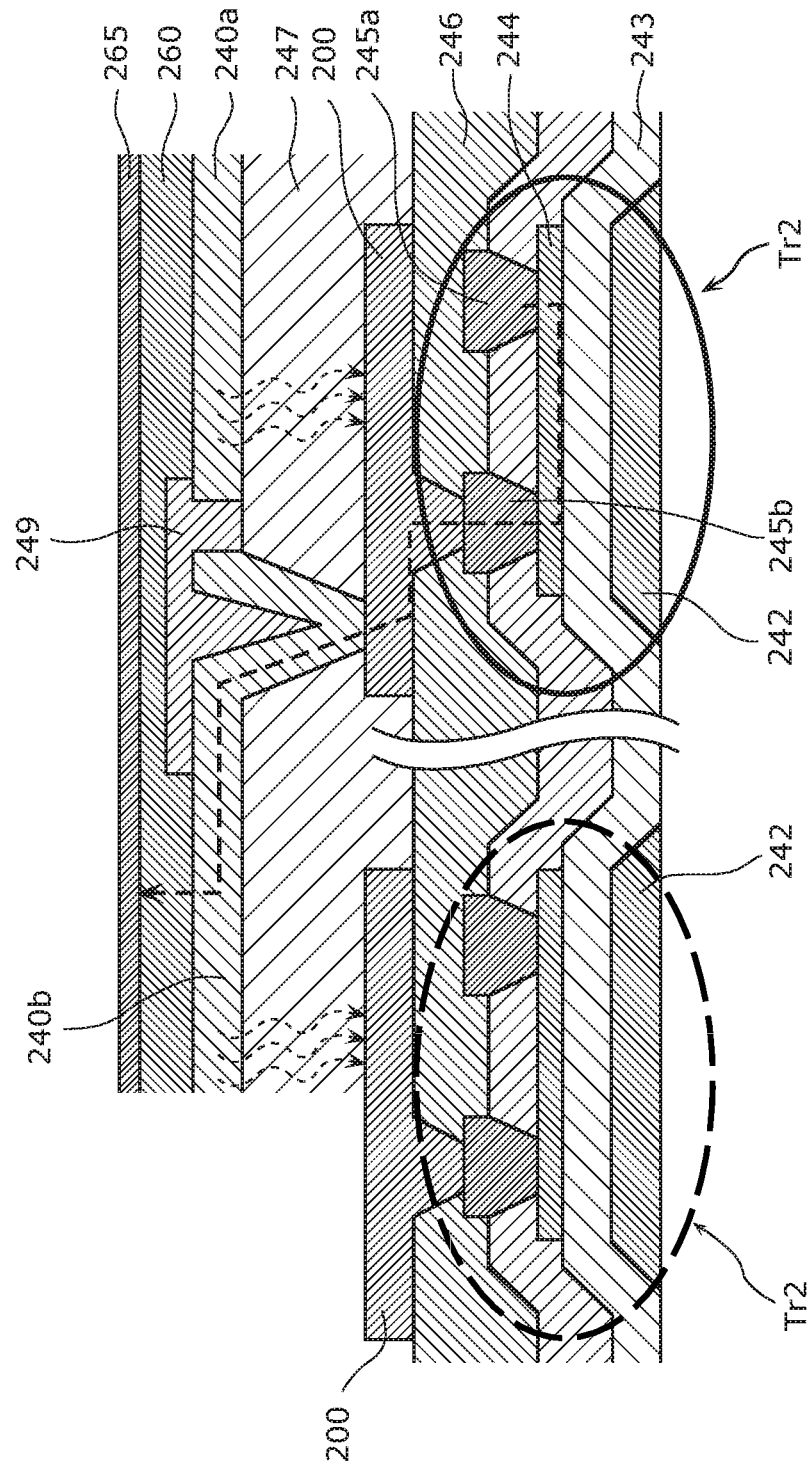
FIG. 8 is a cross-sectional conceptual diagram of a pixel circuit provided to illustrate the advantageous effects of the pixel circuit according to the embodiment.

FIG. 5 is a schematic diagram showing a configuration of a pixel circuit according to the embodiment. FIG. 6 is a top view showing the configuration of the pixel circuit according to the embodiment. FIG. 7 is a cross-sectional view of the pixel circuit taken along the line X-X' and the line X'-X" shown in FIG. 6, FIG. 8 is a cross-sectional view of a pixel circuit provided to illustrate the advantageous effects of the pixel circuit according to the embodiment.

An organic EL display apparatus according to the present embodiment has substantially the same configuration as the organic EL display apparatus shown in FIG. 1 except that the configuration of the unit pixel 120 is different. Accordingly, the following description will be given focusing on the unit pixel 120.

FIG. 5 is a schematic diagram showing a configuration of a pixel circuit 130 provided in a unit pixel 120 according to the present embodiment.

As shown in FIG. 5, the pixel circuit 130 includes a switching transistor Tr1, a driving transistor Tr2, a pixel capacitor Cs, and a light emitting element EL.

The light emitting element EL is, for example, an organic electroluminescent (organic EL) device in the form of a diode including an anode and a cathode. During a predetermined light-emitting period, an electric current corresponding to a data potential according to an image signal is supplied from the driving transistor Tr2 to the light emitting element EL, and the light emitting element EL thereby emits light. The light emitting element EL is not limited to an organic EL device, and may be any generally used device that emits light by a current drive. As the anode electrode used herein, a pixel electrode 140 according to the present embodiment is provided. The pixel electrode 140 is made of, for example, aluminum.

One of the source and the drain of the switching transistor Tr1 is connected to a DATA line 24 of the organic EL display apparatus. The other one of the source and the drain of the switching transistor Tr1 is connected to the gate of the driving transistor Tr2. The gate of the switching transistor Tr1 is connected to the SCAN line 26. The switching transistor Tr1 is turned on (conducted) in response to a control signal supplied from the SCAN line 26, and a signal potential of an image signal supplied from the DATA line 24 is sampled onto the pixel capacitor Cs.

The pixel capacitor Cs is connected to the gate electrode of the driving transistor Tr2. The pixel capacitor Cs stably applies an input voltage to the gate of the driving transistor Tr2 according to the signal potential of the image signal sampled by the switching transistor Tr1. By doing so, the on-state of the driving transistor Tr2 can be controlled by using the signal voltage of the image signal.

The drain of the driving transistor Tr2 is connected to the power supply VDD, and the source of the driving transistor Tr2 is connected to the light emitting element EL. With this configuration, the driving transistor Tr2 supplies an output current from the power supply VDD to the light emitting element EL according to the input voltage applied to the gate of the driving transistor Tr2. As a result, the light emitting element EL emits light according to the image signal supplied from the DATA line 24. A configuration of the driving transistor Tr2 will be described later in detail.

Here, the switching transistor Tr1 and the driving transistor Tr2 are N-channel type TFTs. The conductivity type of the transistors is not limited to that described above, and it is also possible to use P-channel type TFTs instead of N-channel type TFTs. In this case, the position of the source and the drain is reversed. It is also possible to use an N-channel type TFT and a P-channel type TFT in a mixed manner.

A configuration for implementing the pixel circuit is shown in FIGS. 6 and 7. FIG. 6 is a top view showing a configuration of a pixel circuit according to the present embodiment. FIG. 7 is a cross-sectional view taken along the line X-X' and the line X'-X" shown in FIG. 6. In FIGS. 6 and 7, illustration of the light emitting element EL is omitted. Also, FIGS. 6 and 7 show, as an example, a back-channel etch transistor.

In the organic EL display apparatus according to the present embodiment, the pixel electrode 140 connected to a pixel circuit 130 is disposed above an adjacent pixel circuit 130. That is, as shown in FIGS. 6 and 7, a first pixel circuit 130a and a second pixel circuit 130b are disposed adjacent to each other. A first pixel electrode 140a is disposed above the first pixel circuit 130a, and a second pixel electrode 140b is disposed above the second pixel circuit 130b. Among source-drain electrodes 145a and 145b of the driving transistor Tr2 disposed in the first pixel circuit 130a, the source-drain electrode 145b that functions as a source node is connected to the second pixel electrode 140b via a TM-SD contact 148, a top metal electrode 100 and an AM-TM contact 48a. With this configuration, an electric current can be delivered smoothly from the driving transistor Tr2 to the first pixel electrode 140b via the top metal electrode 100.

Hereinafter, the source-drain electrode 145b that functions as a source node will be referred to as "source electrode 145b", and the source-drain electrode 145a that functions as a drain node will be referred to as "drain electrode 145a". Which of the source-drain electrodes 145a and 145b functions as a source node is not limited to the example given below, and may be changed as appropriate.

As shown in FIG. 5, the first pixel circuit 130a includes a switching transistor Tr1, a driving transistor Tr2, a pixel capacitor Cs, and a light emitting element EL.

In the first pixel circuit 130a, as shown in FIGS. 6 and 7, the driving transistor Tr2 includes a gate electrode 142 formed on a substrate (not shown), a gate insulation film 143 formed on the gate electrode 142, a semiconductor layer 144 formed on the gate insulation film 143, a drain electrode 145a and a source electrode 145b formed on the semiconductor layer 144 and the gate insulation film 143. The driving transistor Tr2 also includes a top metal electrode 100 electrically connected to the source electrode 145b

The top metal electrode 100 is made of, for example, a metal such as Cu, Al, Mo, Ti, W, Ag, Ni or Mn or an alloy thereof, or an oxide conductor such as ITO, IZO or AZO, and is formed so as to overlay the channel region of the semiconductor layer 144. Desirably, the top metal electrode 100 is connected to the source electrode 145b at the TM-SD contact 148, and is formed above the semiconductor layer 144 so as to cover the semiconductor layer 144 from the source electrode 145b side to at least an end of the drain electrode 145a, the end being located on the source electrode 145b side. As a result of the top metal electrode 100 being connected to the source side (the source electrode 145b), in the saturation region characteristics of the Id-Vds characteristics of the driving transistor Tr2, the dependency of Id on the fluctuations in Vds is further reduced. That is, it is possible to reduce fluctuations in the pixel current with respect to fluctuations in the voltage of the power supply VDD, and consequently display uniformity is improved.

A planarization film 147 is formed on the top metal electrode 100. A first pixel electrode 140a is formed on the planarization film 147. Although the first pixel electrode 140a is shown by a thick solid line in FIG. 6, for the sake of clarity of illustration of a configuration of the first pixel circuit 130a, the first pixel electrode 140a is shown in a see-through state in FIG. 6. The same applies to the second pixel electrode 140b.

The top metal electrode 100 is formed above the drain electrode 145a and the source electrode 145b via an insulation layer 146. Here, the top metal electrode 100 is electrically connected to, for example, the source electrode 145b, which functions as a source node, via the TM-SD contact 148. The TM-SD contact 148 is formed by, after the insulation layer 146 has been formed, forming a hole at a predetermined position in the insulation layer 146 such that the hole has the source electrode 145b as the bottom surface, and forming the top metal electrode 100 so as to be electrically connected to the source electrode 145b disposed at the bottom surface of the hole.

The top metal electrode 100 may be connected to the drain electrode 145a or may be connected to the source electrode 145b among a pair of the drain electrode 145a and the source electrode 145b formed on the semiconductor layer 144. Also, the top metal electrode 100 may be connected to the drain electrode 145a and the source electrode 145b on the side to which the second pixel electrode 140b is connected, or may be connected to the drain electrode 145a and the source electrode 145b on the side to which the second pixel electrode 140b is not connected among pairs of the drain electrode 145a and the source electrode 145b formed on the semiconductor layer 144.

Note that the second pixel circuit 130b has the same configuration as the first pixel circuit 130a. Accordingly, a detailed description thereof is omitted here.

Furthermore, the source electrode 145b is connected to the second pixel electrode 140b via the TM-SD contact 148, the top metal electrode 100 and the AM-TM contact 48a. The AM-TM contact 48a is formed by, after the planarization film 147 has been formed, forming a hole at a predetermined position in the planarization film 147 such that the hole has the top metal electrode 100 as the bottom surface, and forming the second pixel electrode 140b so as to be electrically connected to the top metal electrode 100 disposed at the bottom surface of the hole. That is, the source electrode 145b is connected to the second pixel electrode 140b via the top metal electrode 100.

With the configuration described above, as indicated by a dotted line with an arrow in FIG. 7, it is possible to construct a path through which an electric current flows through the drain electrode 145a of the first pixel circuit 130a, the channel region formed in the semiconductor layer 144, the source electrode 145b, the top metal electrode 100 and the second pixel electrode 140b in this order in response to the application of voltage on the gate of the driving transistor Tr2. With this configuration, an electric current flows through a light emitting element 260 (see FIG. 8) disposed on the second pixel electrode 140b at a position between the pixel electrode 140b and an upper electrode 265 (see FIG. 8), and the light emitting element 160 emits light.

Also, as shown in FIGS. 6 and 7, the first pixel electrode 140a and the second pixel electrode 140b are not electrically connected. Also, as shown in FIG. 7, a bank 149 is provided between the first pixel electrode 140a and the second pixel electrode 140b.

Also, as shown in FIG. 7, an irradiation region 150 is provided between the first pixel electrode 140a and the second pixel electrode 140b. A part of the top metal electrode 100 is disposed between the first pixel electrode 140a and the second pixel electrode 140b as viewed from above. Accordingly, by defining this portion as the irradiation region 150, for example, by applying laser light to the irradiation region 150 from the back surface, the top metal electrode 100 and the source electrode 145b can be cut off without causing damage to the first pixel electrode 140a and the second pixel electrode 140b, and the short-circuit of the first pixel circuit 130a can be eliminated.

Hereinafter, advantageous effects of the pixel circuit according to the present embodiment will be described. FIG. 8 is a cross-sectional conceptual diagram of a pixel circuit provided to illustrate the advantageous effects of the pixel circuit according to the embodiment. Although FIG. 8 shows an etch-stop transistor structure, but the transistors used in the present embodiment may be back-channel etch transistors as shown in FIG. 7, or may be etch stop transistors as shown in FIG. 8. In FIG. 8, the region surrounded by a solid oval indicates a driving transistor Tr2 of a first pixel circuit 230a, and the region surrounded by a dotted oval indicates a driving transistor Tr2 of a second pixel circuit 230b.

As shown in FIG. 8, in each of the driving transistors Tr2, a top metal electrode 200 is formed so as to overlay the channel region of a semiconductor layer 244. As a result of the top metal electrode 200 shielding the influence of an electric field from a second pixel electrode 240b to the semiconductor layer 244, it is possible to suppress a situation in which the voltage applied to the second pixel electrode 240b electrically connected to the first pixel circuit 230a affects the threshold voltage Vth of the driving transistor Tr2 provided in the second pixel circuit 230b. That is, the top metal electrode 200 functions as a shield against the second pixel electrode 240b, and thus a situation in which the voltage applied to the second pixel electrode 240b affects the threshold voltage Vth of the driving transistor Tr2 provided in the second pixel circuit 230b is suppressed. Accordingly, the threshold voltage Vth of the driving transistor Tr2 does not fluctuate due to the voltage of the pixel electrode located above the driving transistor Tr2, and the degradation of display quality of the second unit pixel 20b can be suppressed.

In FIGS. 6 and 7 described above, the top metal electrode 100 is formed so as to overlay the entire area of the semiconductor layer 144, but it is sufficient that the top metal electrode 100 is formed so as to overlay at least the channel region of the semiconductor layer 144.

As a result of the top metal electrode 100 being formed so as to overlay the entire area of the semiconductor layer 144, it is possible to further suppress a situation in which the voltage applied to the second pixel electrode 140b electrically connected to the first pixel circuit 130a affects the threshold voltage Vth of the driving transistor Tr2 provided in the second pixel circuit 130b. Also, as a result of the top metal electrode 100 being formed so as to overlay at least the channel region of the semiconductor layer 144, the top metal electrode 100 and the source-drain electrodes 145a and 145b function as a shield for the semiconductor layer 144, and thus a situation in which the voltage applied to the second pixel electrode 140b electrically connected to the first pixel circuit 130a affects the threshold voltage Vth of the driving transistor Tr2 provided in the second pixel circuit 130b can be suppressed.

Also, it is desirable that the top metal electrode 100 is opaque. With this configuration, the top metal electrode 100 functions as a light blocking member that prevents outside light or the light emitted by the light emitting element EL from reaching the semiconductor layer 144. As a result, it is possible to suppress fluctuations in the characteristics of the semiconductor layer 144 caused by light and cause the light emitted by the pixel to more closely approach the data potential corresponding to the image signal. In other words, display quality is improved.

As described above, an organic EL display apparatus (image display apparatus) according to one aspect of the present disclosure includes: a first pixel circuit including a driving transistor that drives a light emitting element disposed in a pixel, the driving transistor including a gate electrode, a semiconductor layer, an insulation layer interposed between the gate electrode and the semiconductor layer, and a pair of source-drain electrodes on the semiconductor layer; a second pixel circuit disposed adjacent to the first pixel circuit; a pixel electrode above the second pixel circuit and is electrically connected to one of the pair of source-drain electrodes of the driving transistor of the first pixel circuit; and a top metal electrode that is electrically connected to one of the pair of source-drain electrodes, is provided below the pixel electrode, and is formed so as to cover at least an entire channel region of the semiconductor layer.

With this configuration, the top metal electrode functions as a shield against the second pixel electrode, and thus a situation in which the voltage applied to the second pixel electrode affects the threshold voltage of the driving transistor provided in the second pixel circuit is suppressed. With this configuration, the threshold voltage of the driving transistor does not fluctuate, and the degradation of display quality of the second unit pixel can be suppressed.

Also, one of the pair of source-drain electrodes may be connected to the pixel electrode via the top metal electrode, and the one of the pair of source-drain electrodes connected to the pixel electrode may include an irradiation region provided so as to be irradiated with laser light at a position between the pixel electrode and a pixel electrode disposed adjacent to the pixel electrode as viewed from above.

With this configuration, by applying laser light to the irradiation region, the source-drain electrode can be cut off without causing damage to the first pixel electrode and the second pixel electrode, and the short-circuit of the first pixel circuit can be eliminated.

Also, the top metal electrode may be connected to one of the pair of source-drain electrodes that functions as a source electrode.

With this configuration, it is possible to smoothly deliver an electric current from the driving transistor to the first pixel electrode via the top metal electrode.

Also, the top metal electrode may be formed so as to cover an entire area of the semiconductor layer from above.

With this configuration, it is possible to further suppress a situation in which the voltage applied to the second pixel electrode electrically connected to the first pixel circuit affects the threshold voltage Vth of the driving transistor provided in the second pixel circuit.

Also, the top metal electrode may be opaque.

With this configuration, the top metal electrode functions as a light blocking member that prevents outside light or the light emitted by the light emitting element EL from reaching the semiconductor layer 144. It is therefore possible to suppress fluctuations in the characteristics of the semiconductor layer 144 caused by light and cause the light emitted by the pixel to more closely approach the data potential corresponding to the image signal. Accordingly, the display quality of the image display apparatus can be improved.

Other Embodiments

In the foregoing, the embodiment has been described as an example of a technique disclosed in the present application. However, the technique according to the present disclosure is not limited thereto, and is also applicable to an embodiment obtained by making modification, replacement, addition, omission and the like as appropriate. It is also possible to develop a new embodiment by combining various structural elements described in the above embodiment.

Other embodiments will be described hereinafter.

For example, the pixel circuit 130 of the image display apparatus according to the present disclosure is not limited to the pixel circuit 130 described above, and may be a pixel circuit 130 having another configuration. Also, the operations performed by the pixel circuit 130 are not limited to the operations described above, and other operations may be performed. Also, the transistors of the pixel circuit 130 may be P-channel type transistors, N-channel type transistors or a combination thereof.

Also, the top metal electrode 100 of the driving transistor Tr2 may be formed so as to cover the entire area of at least the channel region of the semiconductor layer 144 from above, or may be formed so as to cover the entire area of the semiconductor layer 144 from above.

Also, the top metal electrode 100 may be connected to one of the pair of source-drain electrodes 145a and 145b formed on the semiconductor layer 144 that functions as a source electrode, or may be connected to one of them that functions as a drain electrode. Also, the top metal electrode 100 may be connected to the source-drain electrodes 145a and 145b on the side to which the second pixel electrode 140b is connected, or may be connected to the source-drain electrodes 145a and 145b on the side to which the second pixel electrode 140b is not connected among pairs of the source-drain electrodes 145a and 145b formed on the semiconductor layer 144.

The embodiment has been described above as an example of a technique according to the present disclosure. For that purpose, the accompanying drawings and the detailed description are provided.

Accordingly, the structural elements illustrated in the accompanying drawings and described in the detailed description include not only structural elements required to solve the problem, but also structural elements that are merely given to illustrate the above technique and thus are not required to solve the problem. For this reason, the structural elements that are not required to solve the problem should not be construed as requirements of the present disclosure just because of the fact that they are illustrated in the accompanying drawings and described in the detailed description.

Also, the embodiment described above is given merely to illustrate the technique according to the present disclosure, and thus various modifications, replacements, additions, omissions and the like can be made within the scope of the claims or the range of equivalency.

INDUSTRIAL APPLICABILITY

The present disclosure is applicable to an EL image display apparatus (an EL display panel). To be specific, the present disclosure is applicable to a video camera, a digital camera, a display that has been built into a pair of goggles, a navigation system, an audio reproduction apparatus (a car audio system, a stereo system, etc.), a computer, a game console, a portable information terminal (a mobile computer, a mobile phone, a portable game console, a digital book, etc.), an image reproduction apparatus including a recording medium (specifically, an apparatus that reproduces an image of the recording medium such as a digital versatile disc (DVD) and includes a display that can display the reproduced image), or the like.

The invention claimed is:

1. An image display apparatus comprising:
    a first pixel circuit including
        a driving transistor that drives a light emitting element disposed in a pixel, the driving transistor including a gate electrode,
        a semiconductor layer,
        an insulation layer interposed between the gate electrode and the semiconductor layer, and
        a pair of source-drain electrodes disposed on the semiconductor layer;
    a second pixel circuit disposed adjacent to the first pixel circuit;
    a pixel electrode disposed above the second pixel circuit and is electrically connected to one of the pair of source-drain electrodes of the driving transistor of the first pixel circuit; and
    a top metal electrode that is
        electrically connected to one of the pair of source-drain electrodes,
        disposed below the pixel electrode, and
        disposed to cover at least an entire channel region of the semiconductor layer.

2. The image display apparatus according to claim 1, wherein one of the pair of source-drain electrodes is connected to the pixel electrode via the top metal electrode, and
    the one of the pair of source-drain electrodes, which is connected to the pixel electrode, has an irradiation region configured to receive laser light irradiation at a position between the pixel electrode and another pixel electrode disposed adjacent to the pixel electrode as viewed from above.

3. The image display apparatus according to claim 1, wherein the top metal electrode is connected to a source electrode among the pair of source-drain electrodes.

4. The image display apparatus according to claim 1, wherein the top metal electrode is disposed to cover the entire area of the semiconductor layer from above.

5. The image display apparatus according to claim 1, wherein the top metal electrode is opaque.

6. The image display apparatus according to claim 1, wherein a void is provided between the pixel electrode and another pixel electrode adjacently disposed to the pixel electrode.

7. The image display apparatus according to claim 1, wherein the pixel electrode is connected to one of the pair of source-drain electrodes through the top metal electrode.

8. The image display apparatus according to claim 1, further comprising an insulating layer interposed between the top metal electrode and the one of the pair of source-drain electrodes except for a TM-SD (top metal source-drain) contact portion, which allows a portion of the top metal electrode to connect directly with the one of the pair of source-drain electrodes.

* * * * *